(12) United States Patent
Suzuki et al.

(10) Patent No.: US 9,000,492 B2
(45) Date of Patent: Apr. 7, 2015

(54) BACK-ILLUMINATED SOLID-STATE IMAGE PICKUP DEVICE

(75) Inventors: Hisanori Suzuki, Hamamatsu (JP);
Yasuhito Yoneta, Hamamatsu (JP);
Yasuhito Miyazaki, Hamamatsu (JP);
Masaharu Muramatsu, Hamamatsu (JP); Koei Yamamoto, Hamamatsu (JP)

(73) Assignee: Hamamatsu Photonics K.K., Hamamatsu-Shi, Shizuoka (JP)

( * ) Notice: Subject to any disclaimer, the term of this patent is extended or adjusted under 35 U.S.C. 154(b) by 0 days.

(21) Appl. No.: 13/258,680

(22) PCT Filed: Mar. 24, 2010

(86) PCT No.: PCT/JP2010/055084
§ 371 (c)(1),
(2), (4) Date: Oct. 20, 2011

(87) PCT Pub. No.: WO2010/110317
PCT Pub. Date: Sep. 30, 2010

(65) Prior Publication Data
US 2012/0038016 A1    Feb. 16, 2012

(30) Foreign Application Priority Data

Mar. 27, 2009  (JP) ................. 2009-079556

(51) Int. Cl.
| | | |
|---|---|---|
| *H01L 27/148* | (2006.01) | |
| *H01L 27/146* | (2006.01) | |
| *H01L 31/0352* | (2006.01) | |
| *H01L 31/0236* | (2006.01) | |

(52) U.S. Cl.
CPC .... *H01L 27/1464* (2013.01); *H01L 31/035281* (2013.01); *H01L 31/02363* (2013.01); *H01L 27/1462* (2013.01); *H01L 27/14625* (2013.01); *H01L 27/14806* (2013.01)

(58) Field of Classification Search
CPC ..................... H01L 27/1464; H01L 27/14806; H01L 31/02363; H01L 31/035281; H01L 31/03529

USPC ............. 257/228, 414, 447, E5.091, E27.15, 257/E27.122, 460, 291, 282, 465, E27.13, 257/E27.151, E31.038, E31.039, E31.13; 348/311; 438/73

See application file for complete search history.

(56) References Cited

U.S. PATENT DOCUMENTS

| | | | |
|---|---|---|---|
| 4,277,793 | A | 7/1981 | Webb |
| 5,120,664 | A | 6/1992 | Murotani |

(Continued)

FOREIGN PATENT DOCUMENTS

| | | |
|---|---|---|
| CN | 101609837 | 12/2009 |
| EP | 1 796 170 | 6/2007 |
| JP | 64-042169 | 2/1989 |
| JP | H6-104414 | 4/1994 |
| JP | H6-244444 | 9/1994 |
| JP | H7-245386 | 9/1995 |
| JP | H7-288335 | 10/1995 |
| JP | 2000-294760 | 10/2000 |
| JP | 2001-358358 | 12/2001 |
| JP | 2005-072097 | 3/2005 |
| TW | 200501441 | 1/2005 |

OTHER PUBLICATIONS

"Etaloning in Back-Illuminated CCDs," Roper Scientific Technical Note, issued by Roper Scientific, 2000.

*Primary Examiner* — Yu Chen
(74) *Attorney, Agent, or Firm* — Drinker Biddle & Reath LLP

(57) ABSTRACT

In a back-illuminated solid-state image pickup device including a semiconductor substrate 4 having a light incident surface at a back surface side and a charge transfer electrode 2 disposed at a light detection surface at an opposite side of the semiconductor substrate 4 with respect to the light incident surface, the light detection surface has an uneven surface. By the light detection surface having the uneven surface, etaloning is suppressed because lights reflected by the uneven surface have scattered phase differences with respect to a phase of incident light and resulting interfering lights offset each other. A high quality image can thus be acquired by the back-illuminated solid-state image pickup device.

5 Claims, 22 Drawing Sheets

(56) References Cited

U.S. PATENT DOCUMENTS

| | | |
|---|---|---|
| 6,611,037 B1 | 8/2003 | Rhodes |
| 2005/0167704 A1* | 8/2005 | Ezaki et al. .................. 257/233 |
| 2005/0179053 A1* | 8/2005 | Ezaki et al. .................. 257/189 |
| 2006/0071276 A1* | 4/2006 | Zundel et al. ................. 257/355 |
| 2007/0138590 A1 | 6/2007 | Wells et al. |
| 2008/0149967 A1* | 6/2008 | Etoh ............................. 257/220 |
| 2009/0303371 A1* | 12/2009 | Watanabe et al. ............. 348/311 |

* cited by examiner

Fig.13 PATTERN A

Fig. 14 — PATTERN A

Fig.15 PATTERN B

Fig.16  PATTERN B

Fig.17 PATTERN B

BACK-ILLUMINATED SOLID-STATE IMAGE PICKUP DEVICE

TECHNICAL FIELD

The present invention relates to a back-illuminated solid-state image pickup device.

BACKGROUND ART

A BT (back-illuminated thinning)-CCD is known as a back-illuminated solid-state image pickup device with which a light incident surface side of a substrate is thinned. According to Non-Patent Literature 1, interference (etaloning) occurs between light to be detected made incident on the BT-CCD and light resulting from the incident light to be detected reflecting from a detection side surface of the BT-CCD, thereby affecting detection characteristics in a near-infrared range. In the literature, to suppress the etaloning, a photosensitive region is increased in thickness and further, an anti-reflection film is provided on the photosensitive region.

CITATION LIST

Non Patent Literature

Non-Patent Literature 1: "Etaloning in Back-Illuminated CCDs," Roper Scientific Technical Note, issued by Roper Scientific, 2000, No. 7.

SUMMARY OF INVENTION

Technical Problem

However, the conventional solution method for BT-CCD sacrifices an intrinsic merit of BT-CCD, which is an improvement of detection sensitivity by thinning, and has not led to essential improvement of image quality.

The present invention has been made in view of this issue and an object thereof is to provide a back-illuminated solid-state image pickup device capable of being improved in image quality by suppression of image degradation due to etaloning.

Solution to Problem

To resolve the above issue, a back-illuminated solid-state image pickup device according to the present invention includes a semiconductor substrate having a light incident surface at a back surface side and a charge transfer electrode disposed at a light detection surface at an opposite side of the semiconductor substrate with respect to the light incident surface and the light detection surface has an uneven surface.

By the light detection surface having the uneven surface, etaloning is suppressed because lights reflected by the uneven surface have scattered phase differences with respect to a phase of incident light and these lights thus offset each other. A high quality image can thus be acquired by the back-illuminated solid-state image pickup device.

The uneven surface is preferably formed only on the light detection surface. That is, the light incident surface does not have any unevenness. This is because in a case where an uneven surface is formed at the light incident surface side, scattering occurs at the surface and the image quality degrades.

Within the uneven surface, respective patterns of unevenness within respective pixels of the back-illuminated solid-state image pickup device are preferably the same. In a case where the unevenness pattern (planar shape and depth) differs among individual pixels, a fixed noise pattern due to interference may occur. With the present invention, the unevenness pattern in each pixel is the same, and the occurrence of such a fixed noise pattern can be suppressed. Here, "same" does not mean sameness in a mathematically rigorous sense but sameness in practical terms, and if a dimensional error or a depth error is within ±10%, patterns shall be regarded as being the same.

Advantageous Effects of Invention

By the back-illuminated solid-state image pickup device according to the present invention, a high-quality image can be acquired.

DESCRIPTION OF EMBODIMENTS

A back-illuminated solid-state image pickup device 100 according to an embodiment shall now be described. Elements that are the same shall be provided with the same symbol and overlapping description shall be omitted.

Figure 1:
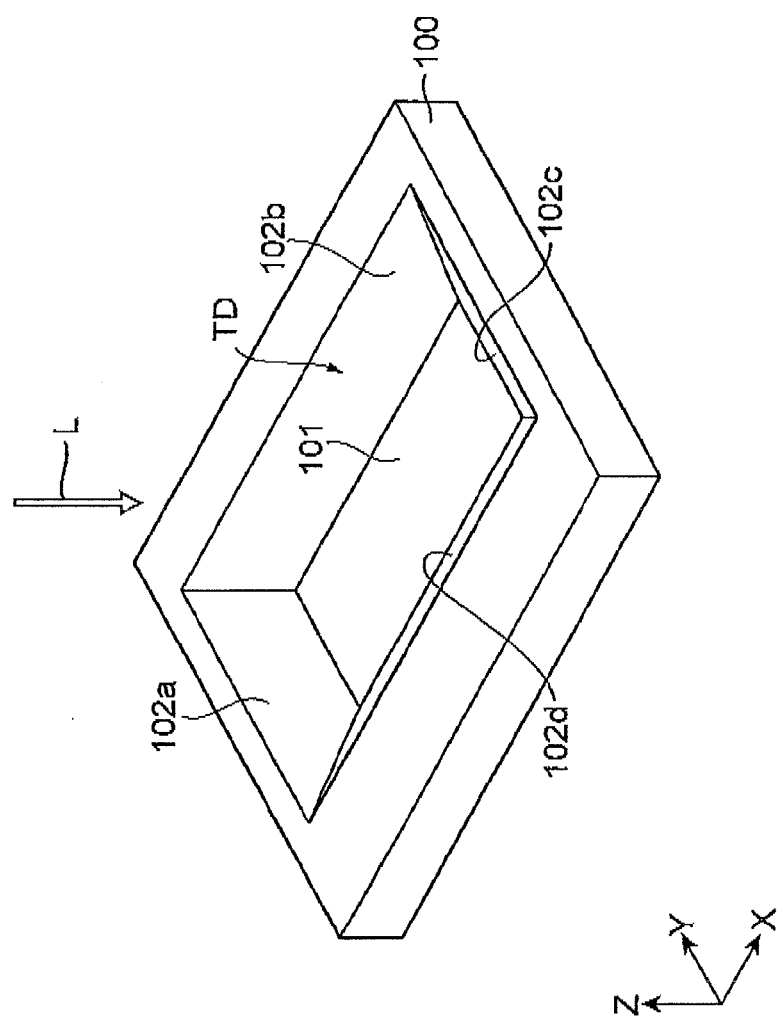
FIG. 1 is a perspective view of a back-illuminated solid-state image pickup device 100 according to an embodiment.

FIG. 1 is a perspective view of the back-illuminated solid-state image pickup device 100 according to the embodiment. For convenience of description, a three-dimensional orthogonal coordinate system made up of an X-axis, a Y-axis, and a Z-axis that are mutually orthogonal is shown in the figure.

The back-illuminated solid-state image pickup device 100 is a BT-CCD (charge coupled device) that has been thinned by etching a back surface side of a semiconductor substrate by an aqueous KOH solution, etc., a depressed portion ID is formed at a central region that has been etched, and a thick frame portion is present at a periphery of the depressed portion TD. Each of side surfaces 102a, 102b, 102c, and 102d of the depressed portion TD is inclined and forms an obtuse angle with respect to a bottom surface 101. The frame portion may be removed by etching to form a back-illuminated solid-state image pickup device that is thinned over its entire region.

The thinned central region of the semiconductor substrate is a photosensitive region (image pickup region) and an optical image L from an object is made incident on the photosensitive region along a negative direction of the Z-axis. The bottom surface 101 of the depressed portion TD of the semiconductor substrate makes up a light incident surface. A CCD for image pickup made up of a plurality of vertical shift registers is formed as pixels in the photosensitive region.

Figure 2:
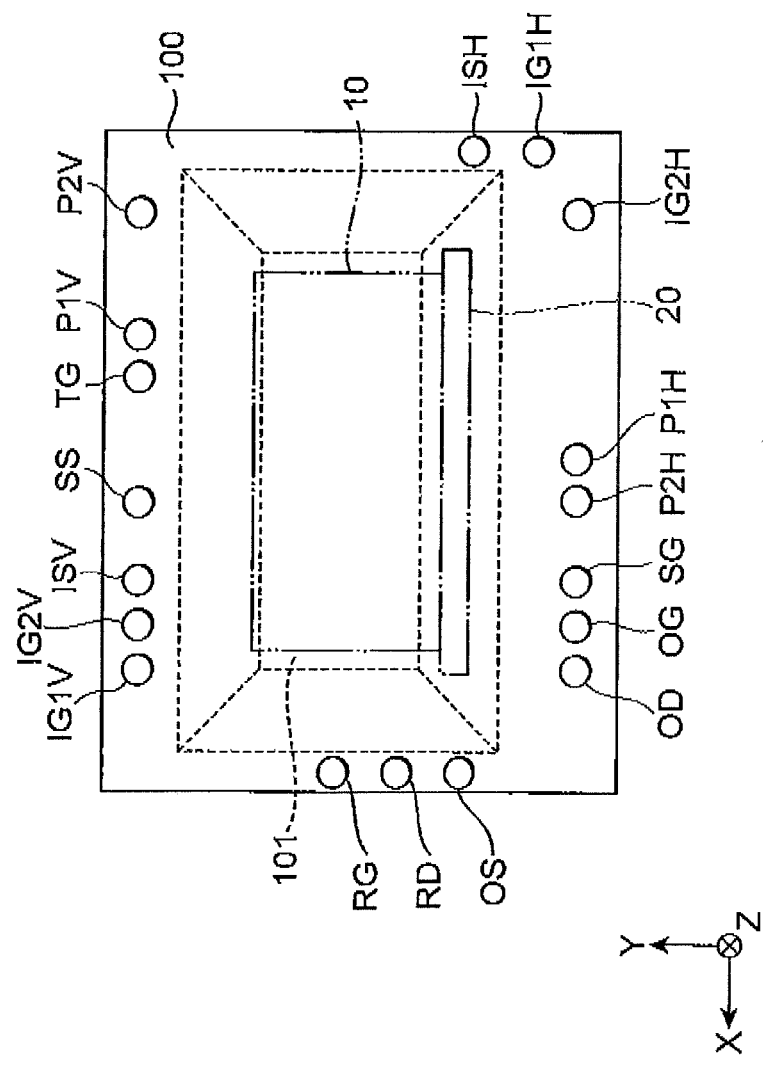
FIG. 2 is a bottom view of the back-illuminated solid-state image pickup device 100 as viewed from a side opposite to a light incident direction.

FIG. 2 is a bottom view of the back-illuminated solid-state image pickup device 100 as viewed from a side opposite to the light incident direction. The image pickup region 10 is formed in a region corresponding to the bottom surface 101 of the thinned semiconductor substrate. The optical image made incident on the image pickup region 10 is converted to a two-dimensional charge image and charges thereof are transferred along a negative direction of the Y-axis. A horizontal shift register 20 is disposed at a terminal in the charge transfer direction of the image pickup region 10, and the charges of the respective pixels that have been transferred in the vertical direction are successively transferred along the X-axis direction. A plurality of electrode pads are disposed at the frame portion of the back-illuminated solid-state image pickup device 100.

The main electrode pads are electrode pads P1V and P2V for applying a two-phase transfer voltage to the charge transfer electrodes, electrode pads P1H and P2H for applying a two-phase transfer voltage to the charge transfer electrodes, an electrode pad SS for connecting the semiconductor substrate to a ground, and electrode pads SG, OG, OD, RG, and RD for reading the charges transferred in the horizontal direction, and an output can be taken out from an electrode pad OS. Other electrode pads may be provided as suited according to specifications, and the present embodiment includes an electrode pad TG for making a charge transfer gate to the horizontal shift register 20 function, electrode pads ISV and ISH for inputting test signals, and electrode pads 1G1V, 1G2V, 1G1H, and 1G2H for making charge transfer gates for the test signal function. As charge transfer types of a CCD, a frame transfer type, an interline transfer type, a full frame transfer type, etc., are known. Various such CCD structures are known and although there is no limitation in particular, a full frame transfer type CCD shall be described as an example.

Figure 3:
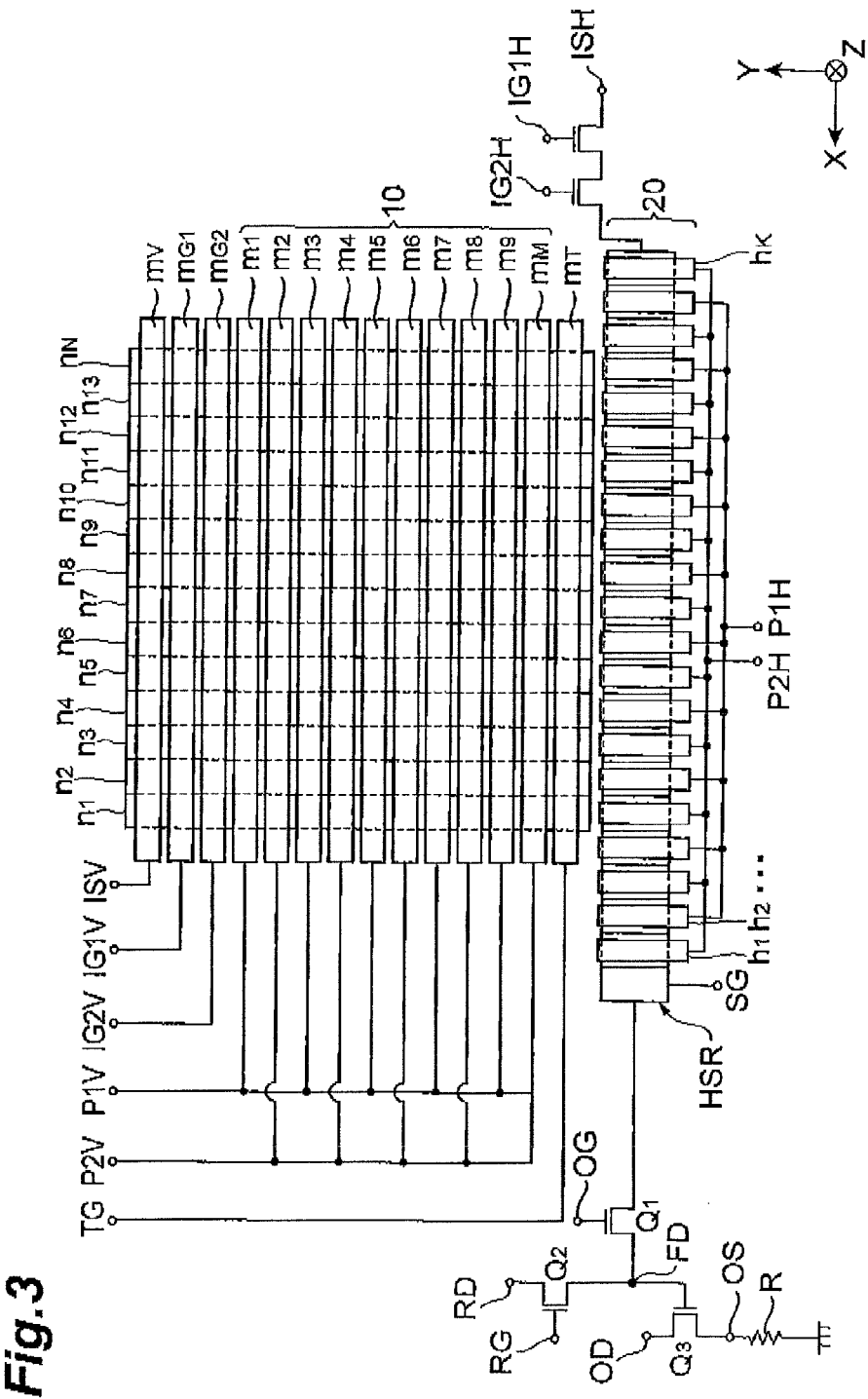
FIG. 3 is a diagram of an image pickup region 10 and a horizontal shift register 20 formed on a top surface side (opposite side with respect to a light incident surface (back surface)).

FIG. 3 is a diagram of the image pickup region 10 and the horizontal shift register 20 formed on a top surface side (opposite side with respect to the light incident surface (back surface)). This figure is a schematic figure and although the respective transfer electrodes extending in the X-axis direction are indicated as being rectangular in shape and as there being gaps present in between the electrodes, in actuality, the electrodes overlap and also, various modes may be employed in regard to shape.

A plurality of vertical shift registers $n_1$ to $n_N$ (where N is an integer no less than 2), that is, a vertical charge transfer CCD is aligned in the image pickup region 10. The actual image pickup region is a central region of the image pickup region 10 and peripheral pixels are shielded from light as necessary. Vertical direction pixels are aligned along the Y-axis, and each of charge transfer electrodes $m_1$ to $m_M$ (where M is an integer no less than 2) extends along the X-axis. The two-phase transfer voltage from the electrode pads P1V and P2V is applied to the charge transfer electrodes $m_1$ to $m_M$ and charges accumulated in the semiconductor region directly below the charge transfer electrodes $m_1$ to $m_M$ are transferred in the vertical direction (Y-axis negative direction). Between vertical CCD channels (semiconductor charge transfer regions) making up the respective vertical shift registers $n_1$ to $n_N$ is formed an isolation region of a conductivity type that is opposite that of the charges flowing through the CCD channels and the isolation regions suppress mutual mixing of charges from different pixel columns.

A transfer gate electrode $m_T$ is disposed at a final position of charge transfer in the vertical direction, and charges flow from the image pickup region 10 into the horizontal shift resistor 20 via the potential directly below the transfer gate electrode $m_T$ and in accordance with the voltage from the electrode pad TG. The horizontal shift register 20 is a horizontal charge transfer CCD, which is aligned along the X-axis and transfers charges in the horizontal direction (X-axis positive direction) and has charge transfer electrodes $h_1$ to $h_K$ (where K is an integer no less than 2) disposed at a semiconductor charge transfer region HSR that extends in the X-axis direction, and these charge transfer electrodes are aligned along the X-axis direction.

The two phase transfer voltage from the electrode pads P1H and P2H is applied to the charge transfer electrodes $h_1$ to $h_K$ and charges accumulated in the semiconductor region directly below the charge transfer electrodes $h_1$ to $h_K$ are transferred in the horizontal direction (X-axis direction). A charge reading circuit is disposed at a final position of the X-axis charge transfer. The charge reading circuit includes a signal gate region positioned at a terminal of the horizontal shift register that is connected to the electrode pad SG. Next to the signal gate region, a floating diffusion region FD is disposed via a transistor $Q_1$ having a MOS-FET structure. The floating diffusion region FD is connected via a reset transistor $Q_2$ to the reset drain electrode pad RD and to a gate electrode of an output transistor $Q_3$. One terminal of the output transistor $Q_3$ is connected to the overflow drain electrode pad OD and the other terminal makes up the output terminal OS. A load resistor R is connected to the output terminal OS. The reset gate electrode pad RG is connected to a gate electrode of the transistor $Q_2$.

A suitable high-level potential is constantly applied to the electrode pads OG, OD, and RD. In a signal reading process, the electrode pad SG and the electrode pad RG are set to the high level, and after setting the potential of the floating diffusion region FD to the reset potential of the reset electrode pad RD, the electrode pad RG is set to the low level so that the output signal is set at the floating level. The electrode pad SG is then set to the low level so that the signal charges, which were temporarily accumulated in the signal gate region, flow into the floating diffusion region FD and the output signal taken out from the electrode pad OS is set at a signal level that is in accordance with an amount of the accumulated charge.

The rest of the arrangement is for performing a test operation, and the test operation is performed by inputting test signals from the electrode pads ISV and ISH and applying suitable potentials to the electrode pads IG1V, IG2V, IG1H, and IG2H. The electrode pad ISV is connected to an electrode $m_V$, which is electrically connected to the semiconductor substrate. The electrode pads IG1V and IG2V are connected to gate electrodes $m_{G1}$ and $m_{G2}$, disposed on the CCD channel via an insulating film. Suitable signals are input into these and if an output that differs from that of a normal case is obtained, the device is judged to be abnormal.

Figure 21:
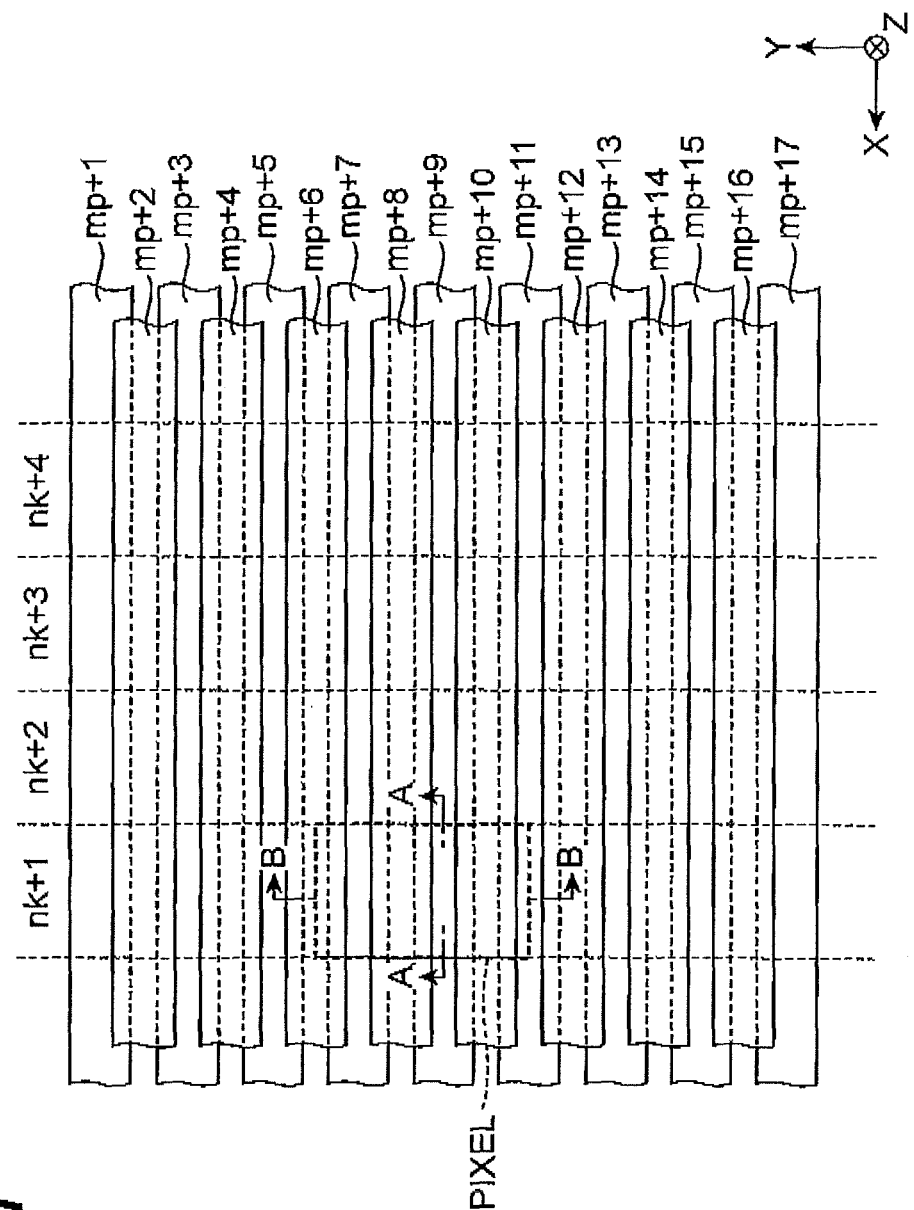
FIG. 21 is a plan view of an image pickup region for describing a structure of charge transfer electrodes 2.

Also, each pixel is made up of an intersection region of each of the CCD channels $n_N$ and several transfer electrodes $m_M$ shown in FIG. 3 (see the pixel PIXEL in FIG. 21).

Figure 4:
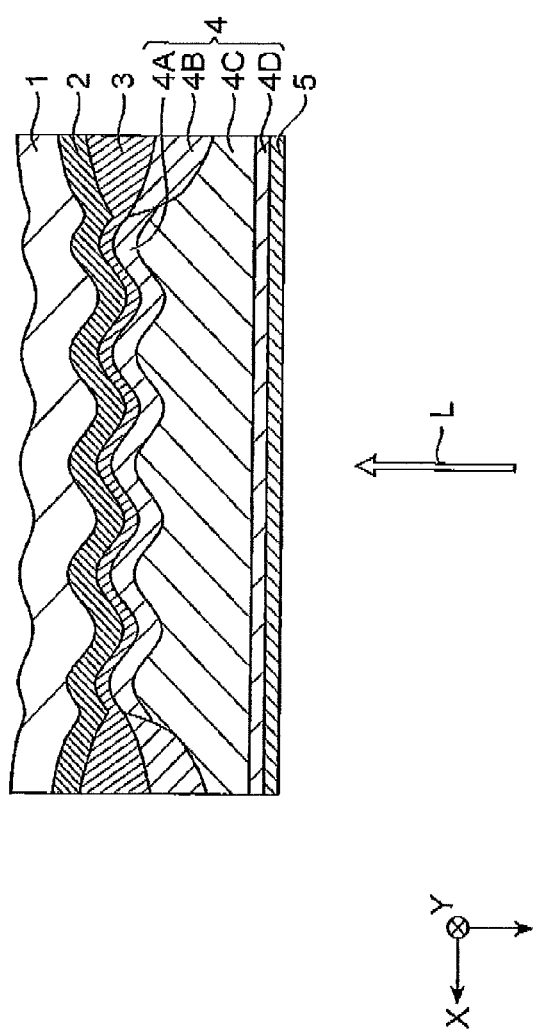
FIG. 4 is a longitudinal sectional view of a single pixel taken along an XZ plane.

FIG. 4 is a longitudinal sectional view of a single pixel taken along an XZ plane.

The incident light L enters from the back surface (light incident surface) of the semiconductor substrate. That is, the semiconductor substrate has the light incident surface. The pixel includes, in an order starting from the substrate top surface side, a protective film 1, charge transfer electrodes 2 (=respective charge transfer electrodes $m_1$ to $m_M$ shown in FIG. 3), an insulating layer 3, the semiconductor substrate 4 made of Si, and an antireflection film 5. The semiconductor substrate 4 includes a P-type semiconductor substrate 4C, an N-type semiconductor layer 4A formed on the P-type semiconductor substrate 4C, an accumulation layer 40 formed at a back surface side of the P-type semiconductor substrate 4C, and isolation regions 4B formed at both sides of the CCD channel. The P-type semiconductor substrate 4C and the N-type semiconductor layer 4A contact to form a PN junction, and a buried channel type CCD is thereby arranged. The N-type semiconductor layer 4A (PN junction) may be omitted and in this case, the CCD functions as a surface channel type CCD.

In the present example, the protective film 1 is formed of BPSG (boro-phospho silicate glass), the charge transfer electrode 2 is made of polysilicon, the insulating layer 3 is made of $SiO_2$, and both the isolation regions 4B and the accumulation layer 4D are made of Si added with a high concentration of a P-type impurity. The pixel functions even when the conductivity types P and N of the semiconductors are interchanged. "High concentration" means that the impurity concentration is higher than the impurity concentration of the P-type semiconductor substrate 4C and is favorably a concentration of no less than $1 \times 19 \text{ cm}^{-3}$.

Here, the back-illuminated solid-state image pickup device has charge transfer electrodes 2 disposed at a light detection surface at the opposite side of the semiconductor substrate 4 with respect to the light incident surface and the light detection surface (the surface in the Z-axis negative direction of the N-type semiconductor layer 4A) has an uneven surface. Obviously, a surface in the Z-axis positive direction of the N-type semiconductor layer 4A, and likewise, a surface in the Z-axis negative direction of the P-type semiconductor layer 4C, both surfaces of the insulating layer 3, and both surfaces of the charge transfer electrodes 2 also have uneven surfaces.

Figure 7:
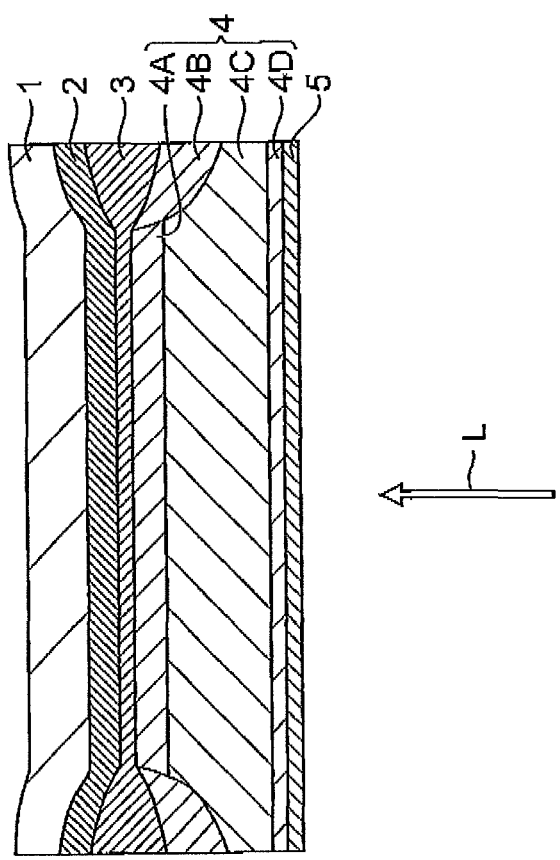
FIG. 7 is a sectional view of a pixel that is a comparative example.

By the light detection surface having the uneven surface, etaloning is suppressed because lights reflected by the uneven surface have scattered phase differences with respect to a phase of incident light and these lights thus offset each other. A high quality image can thus be acquired by the back-illuminated solid-state image pickup device. FIG. 7 shows a cross section of a pixel that is a comparative example and here, the light detection surface of the semiconductor substrate is flat. With the exception that an uneven surface is not formed, the structure shown in FIG. 7 is the same as that shown in FIG. 4.

With the embodiment shown in FIG. 4, the uneven surface is formed only on the light detection surface. That is, the back surface of the semiconductor substrate 4, which is the light incident surface, does not have any unevenness and is flat. This is because in a case where an uneven surface is formed at the light incident surface side, scattering occurs at this surface and the image quality degrades.

When the optical image L enters the semiconductor substrate 4 from the back surface, photoelectric conversion is performed inside the semiconductor substrate 4 and carriers are generated. The carriers are accumulated in regions below the charge transfer electrodes 2 and are transferred in the Y-axis direction upon application of the transfer voltage. The uneven surface formed at the light detection surface of the semiconductor substrate 4 shall now be described.

Figure 5:
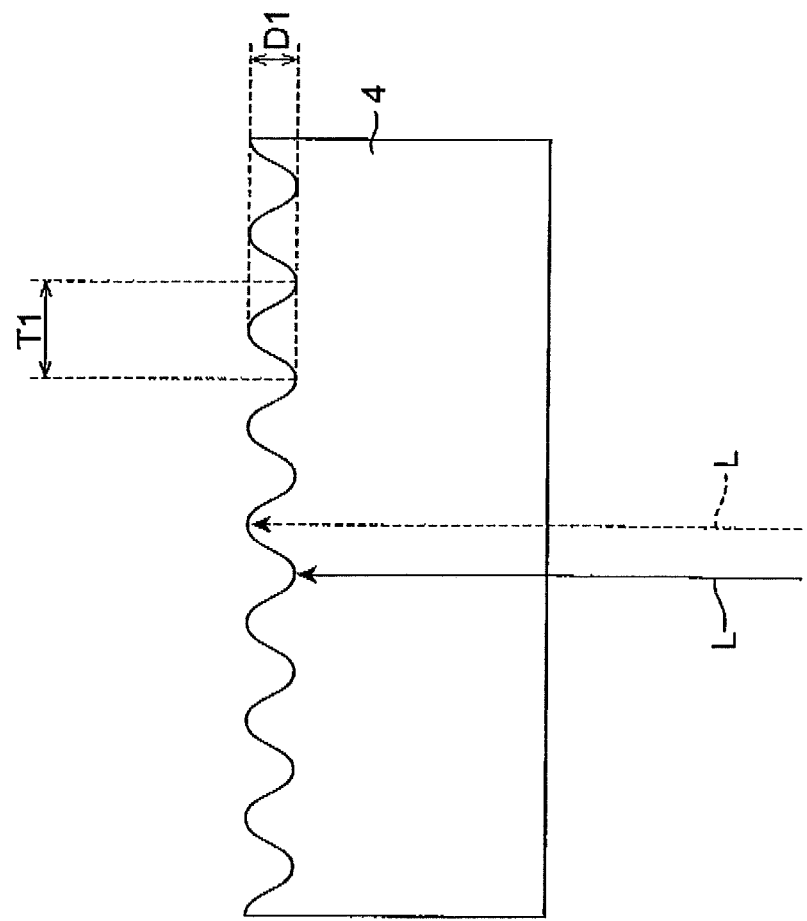
FIG. 5 is an explanatory diagram extracting and showing only a semiconductor substrate 4.

FIG. 5 is an explanatory diagram extracting and showing only the semiconductor substrate 4. Let D1 be a distance (distance along a thickness direction of the semiconductor substrate) between a deepest portion of a depressed portion and an apex or top surface of a projected portion and T1 be a shortest distance between the deepest portions of adjacent depressed portions. A projected portion is a shape having height relative to a depressed portion, and in a case where a plurality of depressed portions are formed in a flat surface, the flat surface shall be the top surface of a projected portion. Oppositely, in a case where a plurality of projections are erected from a flat surface, the deepest portion of a depressed portion shall be the flat surface.

With the uneven structure of the present example, the distance T1 is equal within the surface and the unevenness pattern that is formed has periodicity. The distance T1 may be the shortest distance between adjacent projected portions instead. The optical image L enters from the substrate back surface and, here, a component of the optical image L that is indicated by a solid line and is irradiated onto the back surface side of the deepest portion of a depressed portion and a component that is indicated by a dotted line and is irradiated onto the apex or top surface of a projected portion shall be considered. An optical phase difference corresponding to the distance D1 arises between these components. If d is a thickness (average) of the semiconductor substrate 4, $\lambda$ is a wavelength of incident light, n is a refractive index of silicon, $\theta$ is an incidence angle, and m is a natural number, in a case where $d=17 \mu m$, $\lambda=850 \text{ nm}$, $n=4$, $\theta=0°$, and $m=160$, a thickness of the semiconductor substrate 4 necessary for phase inversion is determined to be no less than 0.06 μm by an interference equation ($2nd/\cos \theta = m\lambda$, in a case where the incidence angle $\theta$ is taken with respect to a perpendicular line of the top surface). Also, a range of the distance D1 that is effective for suppression of interference is preferably set to 0.06 to 1 μm.

Also, in the uneven surface, respective patterns of unevenness within the respective pixels of the back-illuminated solid-state image pickup device are the same. In a case where the unevenness pattern (planar shape and depth) differs among individual pixels, a fixed noise pattern due to interference may occur. With the present invention, the unevenness pattern in each pixel is the same, and the occurrence of such a fixed noise pattern can be suppressed. Here, "same" does not mean sameness in a mathematically rigorous sense but sameness in practical terms, and if a dimensional error or a depth error is within ±10%, patterns shall be regarded as being the same.

Figure 6:
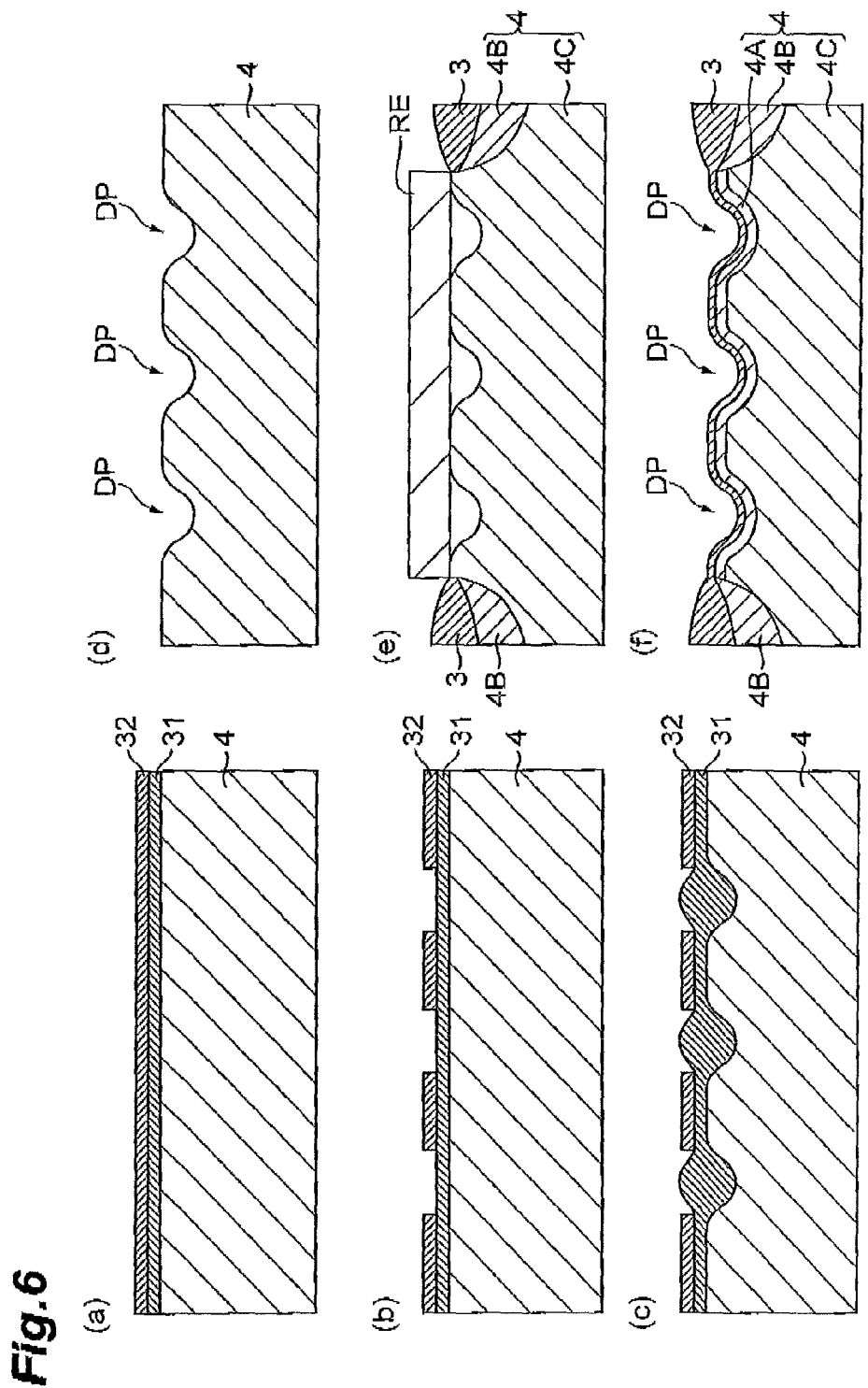
FIG. 6 shows diagrams of a method for manufacturing the back-illuminated solid-state image pickup device.

FIG. 6 shows diagrams of a method for manufacturing the back-illuminated solid-state image pickup device.

First, a P-type semiconductor substrate 4 is prepared. Next, a top surface of the semiconductor substrate 4 is thermally oxidized to form a first insulating layer 31 made of $SiO_2$, and then a second insulating layer 32 made of $SiN_x$ is formed on the first insulating layer 31 by a sputtering method, etc. (FIG. 6(a)). Further, patterning is performed using a photoresist so that the second insulating layer 32 is made to have a plurality of openings and regions of the first insulating layer 31 directly below the openings are exposed to an exterior (FIG. 6(b)). Thereafter, using the second insulating layer 32 as a mask, a top surface of the first insulating layer 31 is selectively oxidized and increased in thickness (FIG. 6(c)). Next, the second insulating layer 32 is removed by etching and further, the first insulating layer 31 is removed by etching. A plurality of depressed portions DP are thereby formed in a region that is to become the light detection surface of the semiconductor substrate 4 (FIG. 6(d)).

A high temperature phosphoric acid may be used as an etching solution for $SiN_x$, hydrofluoric acid may be used as the etching solution for $SiO_2$, and obviously $SiN_x$ may be removed by dry etching using $CF_4$, etc. $SiO_2$ is used at the foundation side, and thus if a large number of openings are formed in the second insulating layer 32, which is made of $SiN_x$, the upper second insulating layer 32 is lifted off and removed in a process of wet etching the first insulating layer 31.

Next, a mask RE is patterned and formed on the region in which the plurality of depressed portions DP have been formed (FIG. 6(e)). The mask RE may be made of an inorganic insulating layer patterned using a suitable resist, or may be arranged from a liquid photoresist itself, or may be a dry film or other resist sheet. With the mask RE being coated on the semiconductor substrate 4, the P-type impurity is added to the substrate top surface using an ion implantation method or diffusion method to form the isolation regions 4B, and thereafter, thermal oxidation is performed to form the insulating layer 3 on the isolation regions 4B. The order of the above steps may be reversed. In a case where thermal oxidation is performed, an inorganic material with heat resistance is used as the mask RE, or in a case where the mask RE is made of a resist, patterning that replaces the resist with an inorganic material with heat resistance is performed.

The mask RE is then removed and further thermal oxidation is performed. The insulating layer 3, made of $SiO_2$, is thereby formed on the silicon light detection surface as well and a gate insulating film is formed along the shapes of the depressed portions DP. An N-type impurity is ion-implanted via the insulating layer 3 into an interior of the semiconductor substrate to form the N-type semiconductor layer 4A in a region directly below the insulating layer 3. The initial semiconductor substrate is the P-type semiconductor substrate 4C and thus a PN junction is formed between the semiconductor layer and the substrate. Next, the charge transfer electrodes 2, made of Al or other metal or polysilicon, are formed on the insulating layer 3 and the protective film 1, made of BPSG, is formed thereabove.

Then, as shown in FIG. 4, the P-type impurity of high concentration is added to the back surface side of the semiconductor substrate 4 to form the accumulation layer 4D and then the antireflection film 5 is formed on the accumulation layer 4D. The antireflection layer 5 is formed of a dielectric multilayer film and is formed, for example, by laminating oxides of Si and Ge. Although the above-described back-illuminated solid-state image pickup device is completed by the above process, the actual structure is one in which adjacent charge transfer electrodes 2 overlap, and thus after the charge transfer electrodes 2 of a lower layer have been formed, the charge transfer electrodes 2 of an upper layer are formed via an insulating layer that serves as a spacer.

FIG. 21 is a plan view of an image pickup region for describing the structure of the charge transfer electrodes 2 (mp+1 to mp+17 . . . ) of the present example and shows a plurality of charge transfer electrodes extending in the X-axis direction and CCD channels $n_N$ (nk+1 to nk+4) extending in the Y-axis direction (here, p and k are integers). A region surrounded by dotted lines PIXEL in the figure corresponds to being a single pixel. FIG. 4 is a sectional view of this pixel taken along arrows A-A.

Figure 22:
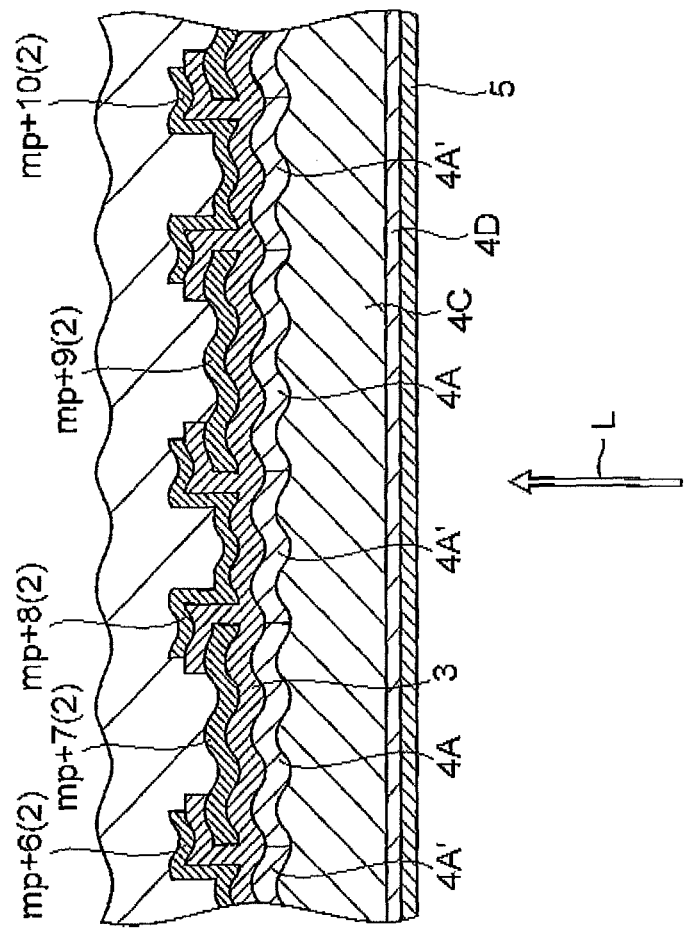
FIG. 22 is a sectional view taken along arrows B-B of a pixel shown in FIG. 21.

Also, a sectional view of the pixel taken along arrows B-B is shown in FIG. 22. Low-concentration N-type semiconductor regions 4A' are formed directly below the upper layer electrodes mp+6, mp+8, and mp+10. "Low concentration" means that the impurity concentration is lower than that of the N-type semiconductor regions 4A. The low-concentration N-type semiconductor regions 4A' are formed to be lower in impurity concentration than the N-type semiconductor regions 4A. Methods for controlling the impurity concentration include a method of differing timings of formation and impurity addition amounts of the regions, a method of making the insulating layer 3 thick in thickness at the low concentration side and performing ion implantation via the insulating layer, etc.

Etaloning (interference) in a comparative example (structure of FIG. 7) shall now be described.

Figure 8:
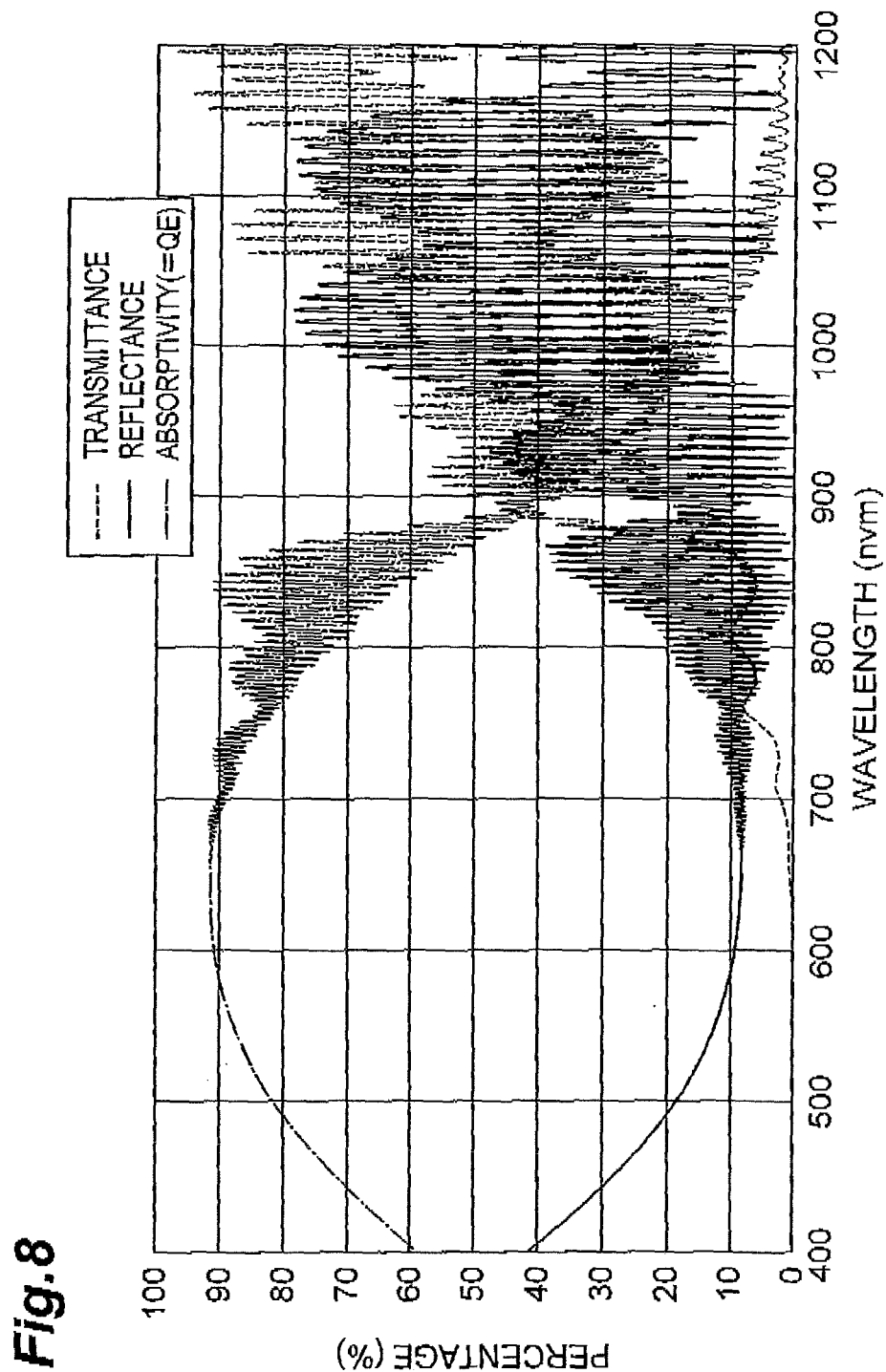
FIG. 8 is a graph of relationships of transmittance (%), reflectance (%), and absorptivity (%) with respect to various wavelengths (nm).

FIG. 8 is a graph of relationships of transmittance (%), reflectance (%), and absorptivity (%) with respect to various wavelengths (nm).

Although interference is normally not a major problem in visible light image pickup, with a back-illuminated solid-state image pickup device, when the wavelength increases to longer than approximately 750 nm and reaches a near infrared range, the transmittance (%), reflectance (%), and absorptivity (=QE) (%) oscillate greatly according to wavelength due to interference. The absorptivity decreases in accordance with increase of wavelength. In the spectrum curve oscillation phenomenon, an oscillation component of a scale of several nm is due to interference in Si, and an oscillation component of a scale of 100 nm is due to interference in a charge transfer electrode (polysilicon) or an insulating layer ($SiO_2$). Image pickup in the near infrared range has come to be desired recently, and reduction of such interference components is desirable.

Figure 9:
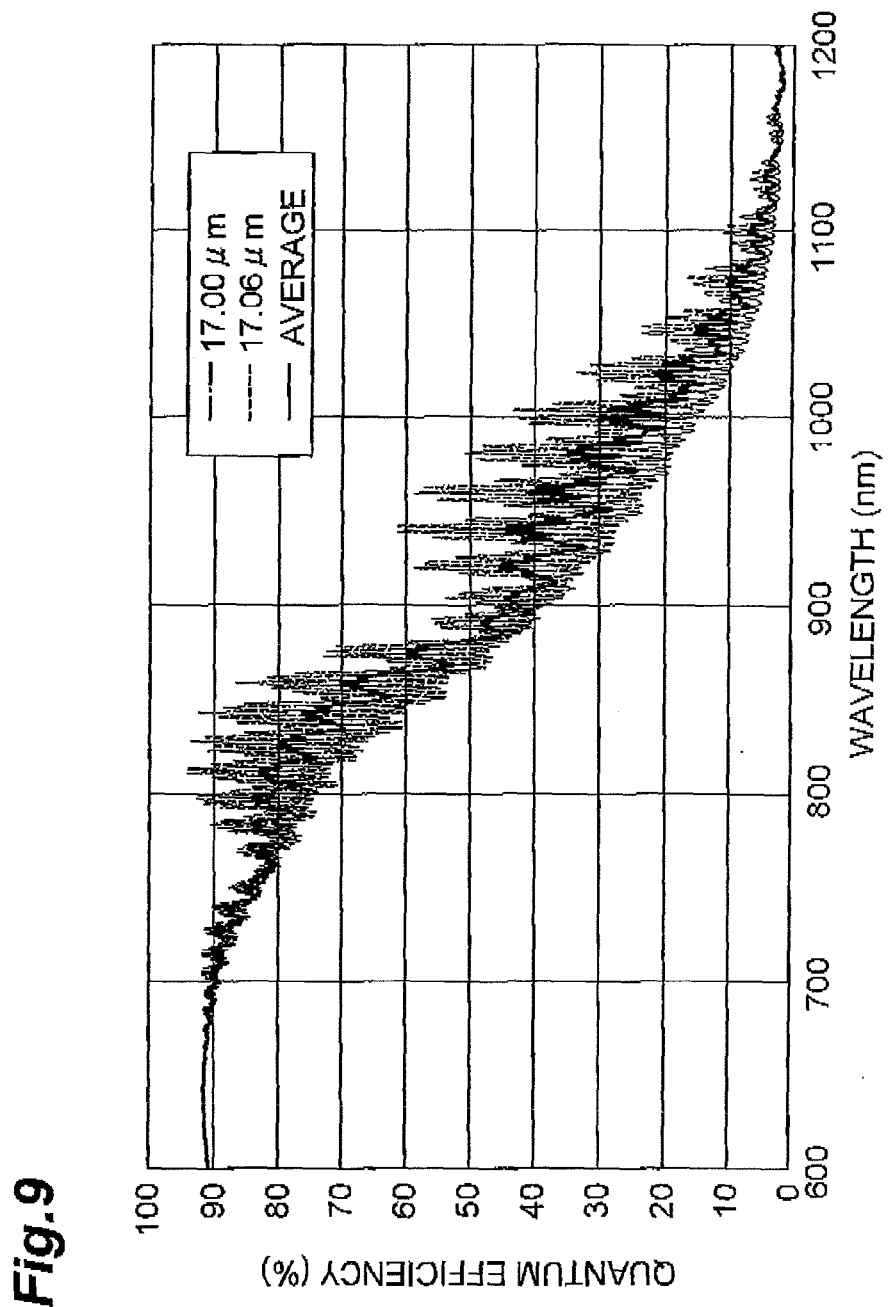
FIG. 9 is a graph of relationships of wavelength (nm) and quantum efficiency (%) in Si of different thicknesses (17.00 µm and 17.06 µm).
Figure 10:
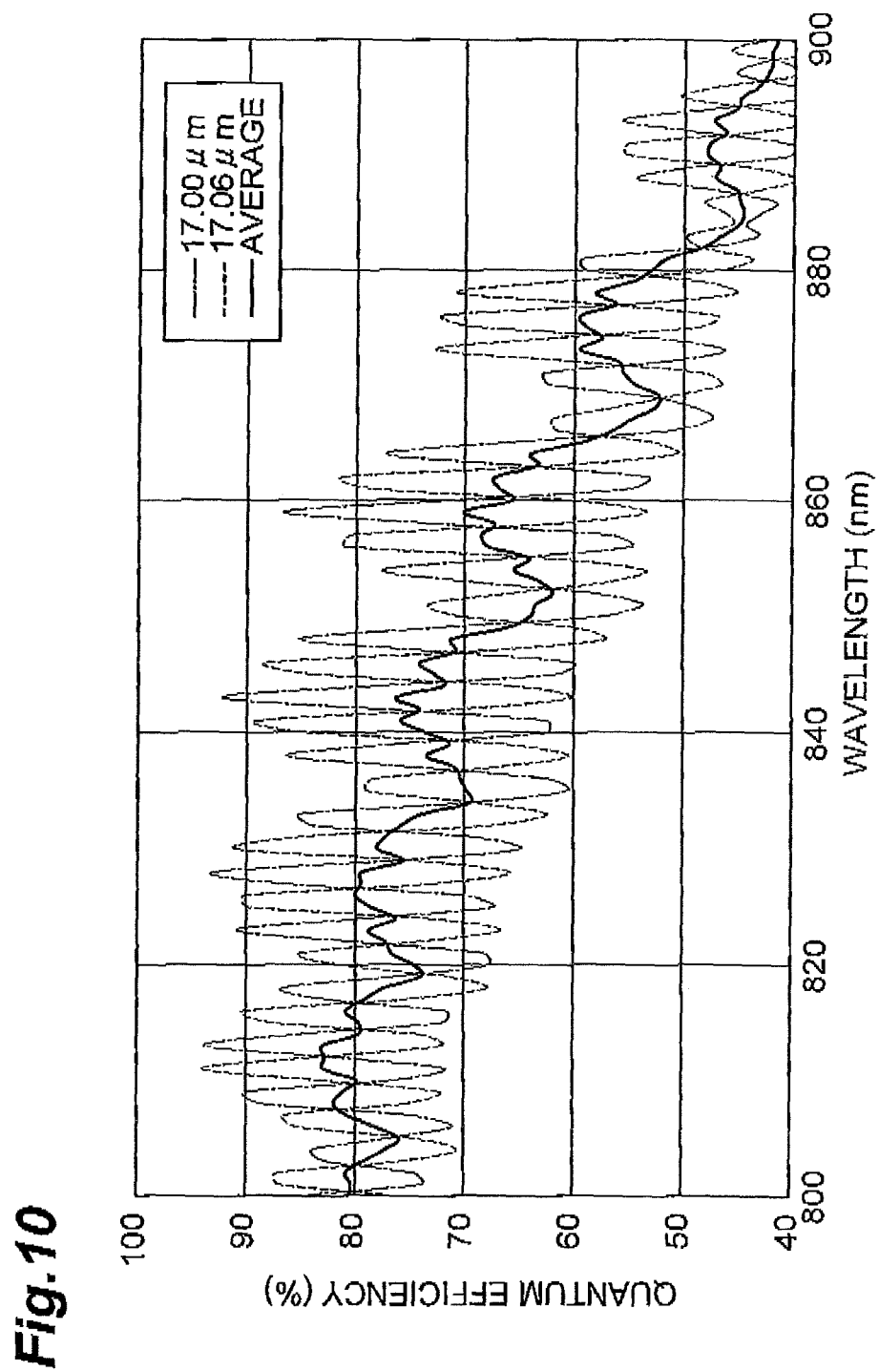
FIG. 10 is a partially enlarged view of the graph of FIG. 9.

FIG. 9 is a graph of relationships of wavelength (nm) and quantum efficiency (QE) (%) in Si of different thicknesses (17.00 μm and 17.06 μm). FIG. 10 is a partially enlarged view of the graph shown in FIG. 9. Although the quantum efficiency decreases with increase of wavelength, phase inversion occurs due to the difference of thickness, and spectral variation of an average value is small. That is, with the back-illuminated solid-state image pickup device of the embodiment, the spectral variation is made small because the light detection surface has an uneven surface.

Figure 11:
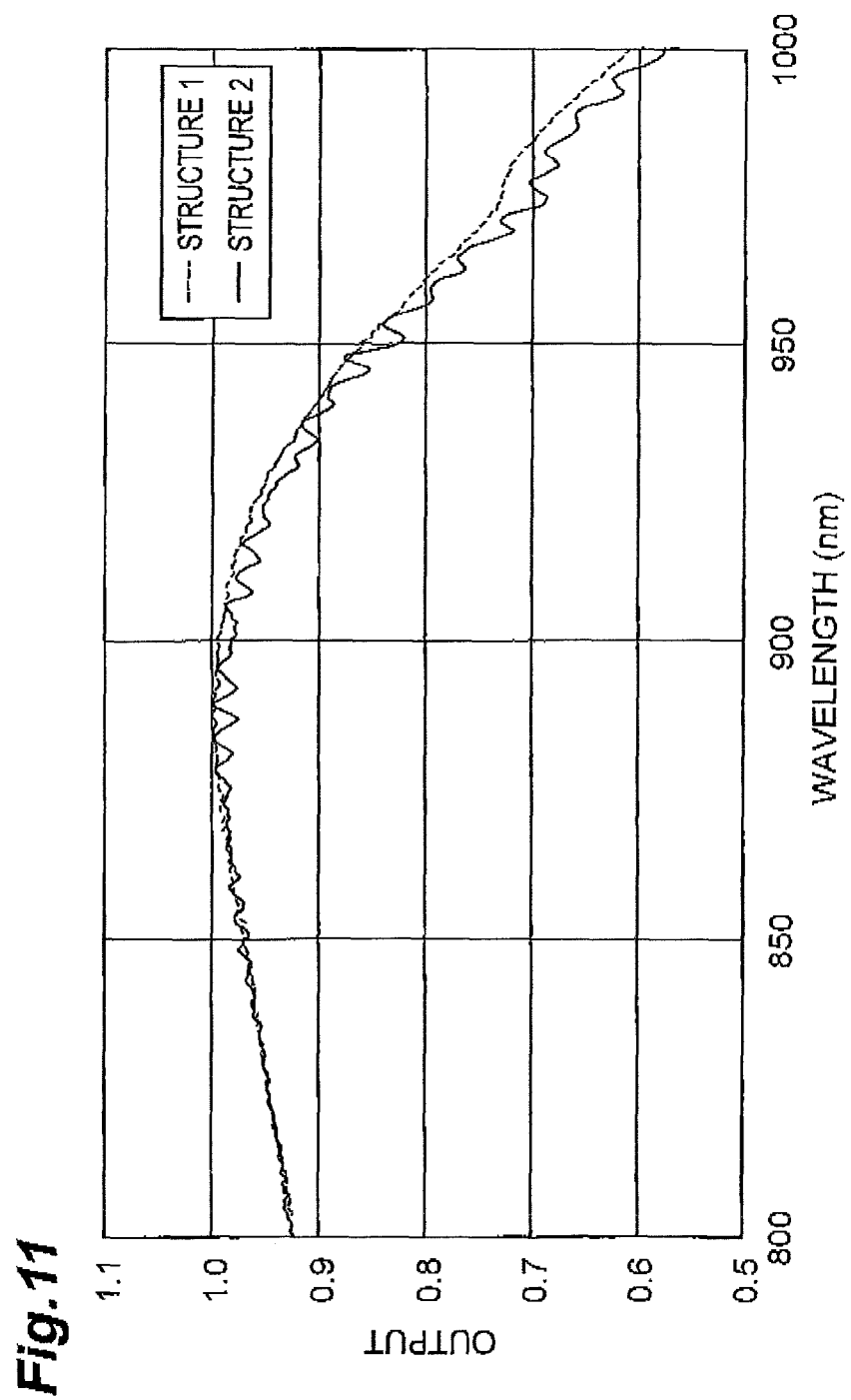
FIG. 11 is a graph of relationships of wavelength (nm) of incident light and outputs (normalized outputs; maximum value=1.0) of the back-illuminated solid-state image pickup device of the embodiment (structure 1) and the back-illuminated solid-state image pickup device of the comparative example (structure 2).

FIG. 11 is a graph of relationships of wavelength (nm) of incident light and outputs (normalized outputs; maximum value=1.0) of the back-illuminated solid-state image pickup device of the embodiment (structure 1) and the back-illuminated solid-state image pickup device of the comparative example (structure 2). Whereas with the embodiment, the oscillation of the spectrum is suppressed, the spectrum oscillates greatly with the comparative example.

Figure 12:
FIG. 12 is an electron micrograph of an uneven structure of a solid-state image pickup device surface according to the embodiment (unevenness pattern A).
Figure 13:
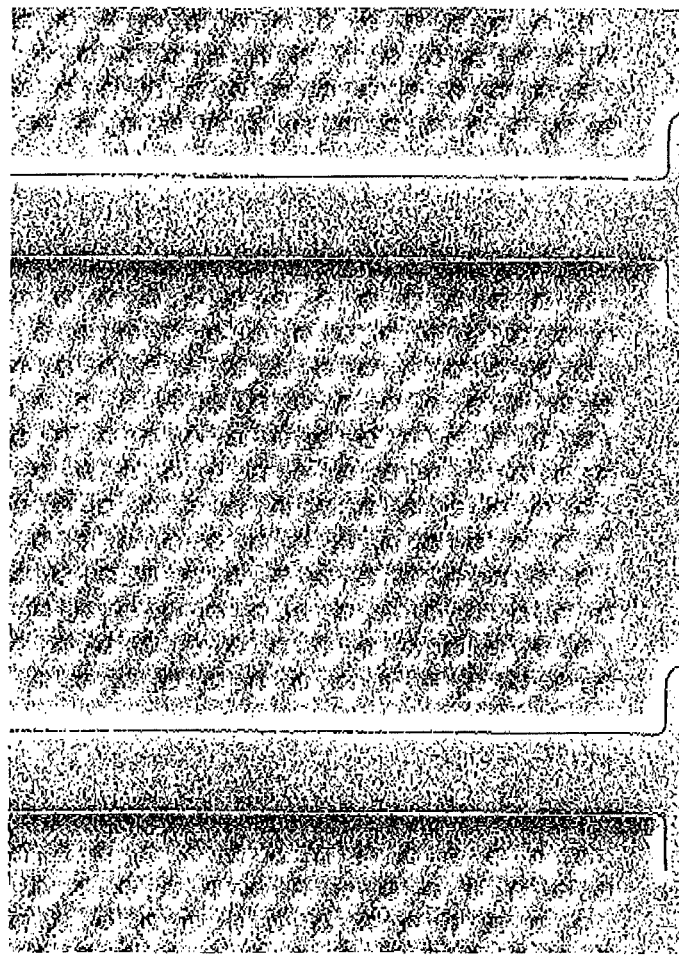
FIG. 13 is a magnified photograph of the photograph of FIG. 12.
Figure 14:
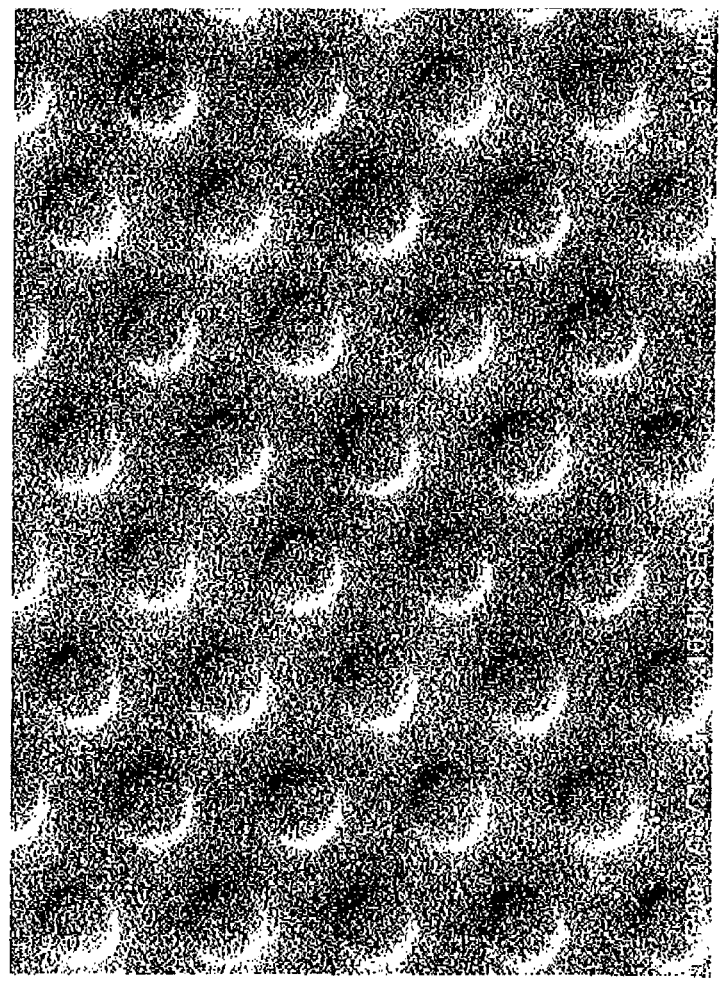
FIG. 14 is a magnified photograph of the photograph of FIG. 13.

FIG. 12 is an electron micrograph of an uneven structure of a solid-state image pickup device surface according to the embodiment (unevenness pattern A). FIG. 13 is a magnified photograph of the photograph of FIG. 12, and FIG. 14 is a magnified photograph of the photograph of FIG. 13. The depth of the depressed portion is 0.1 μm. With the pattern A, a diameter of an opening of the circular depressed portion is 1 μm, the distance T1 between centers of adjacent depressed portions is 2 μm, and a separation distance of the depressed portions is 1 μm.

Figure 15:
FIG. 15 is an electron micrograph of an uneven structure of a solid-state image pickup device surface according to a modification example of the embodiment (unevenness pattern B).
Figure 16:
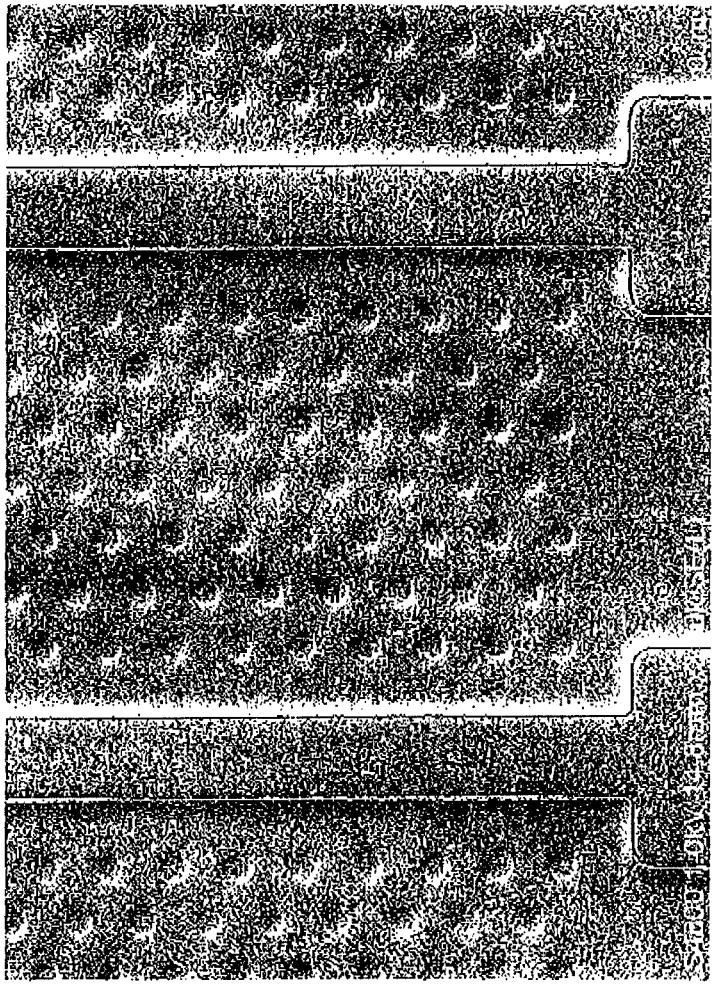
FIG. 16 is a magnified photograph of the photograph of FIG. 15.
Figure 17:
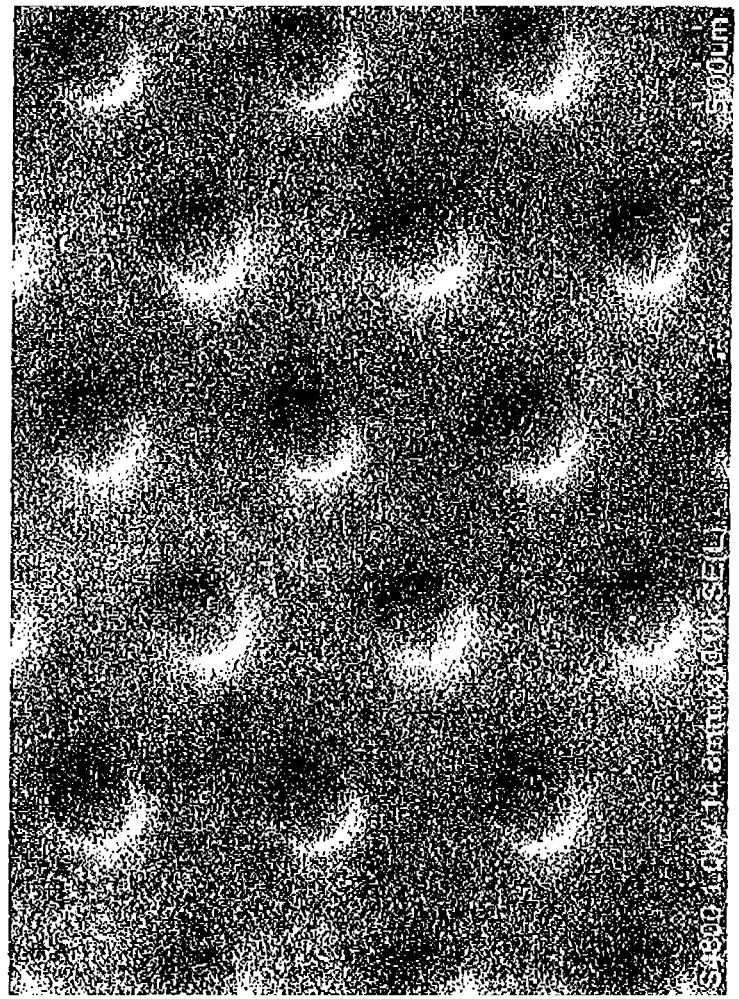
FIG. 17 is a magnified photograph of the photograph of FIG. 16.

FIG. 15 is an electron micrograph of an uneven structure of a solid-state image pickup device surface according to a modification example of the embodiment (unevenness pattern B). The depth of the depressed portion is 0.1 μm. With the pattern B, a density of the depressed portions is decreased with respect to the pattern A. FIG. 16 is a magnified photograph of the photograph of FIG. 15, and FIG. 17 is a magnified photograph of the photograph of FIG. 16. With the pattern B, the diameter of the opening of the circular depressed portion is 1 μm, the distance T1 between centers of adjacent depressed portions is 3 μm, and the separation distance of the depressed portions is 2 μm.

Figure 18:
FIG. 18 is an electron micrograph of an uneven structure of a solid-state image pickup device surface according to a modification example of the embodiment (unevenness pattern C).
Figure 19:
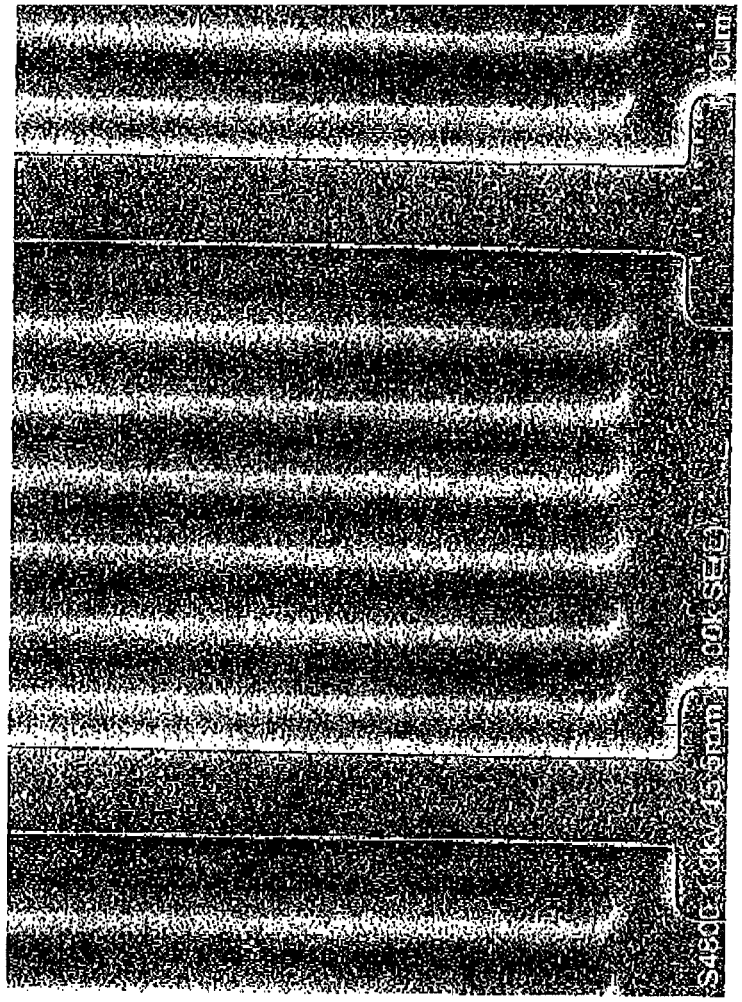
FIG. 19 is a magnified photograph of the photograph of FIG. 18.
Figure 20:
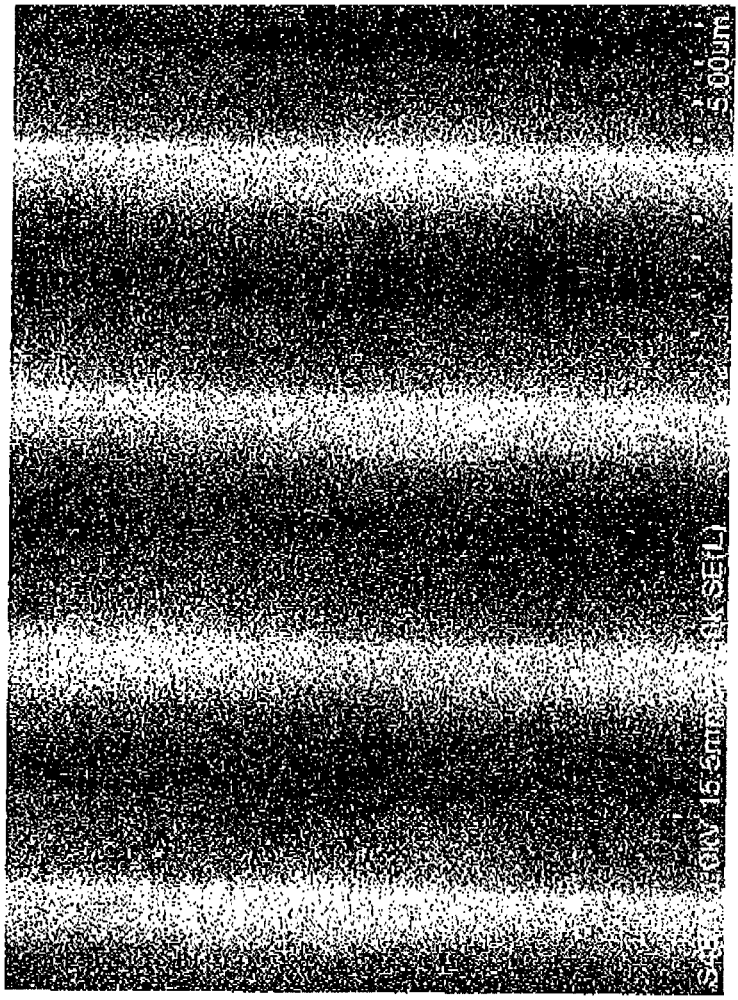
FIG. 20 is a magnified photograph of the photograph of FIG. 19.

FIG. 18 is an electron micrograph of an uneven structure of a solid-state image pickup device surface according to a modification example of the embodiment (unevenness pattern C). The depth of the depressed portion is 0.1 μm. With the pattern C, the shape of the depressed portion is a semi-cylindrical surface shape (groove shape) extending along the Y-axis. FIG. 19 is a magnified photograph of the photograph of FIG. 18, and FIG. 20 is a magnified photograph of the photograph of FIG. 19. With the pattern C, a width of the line-shaped depressed portion is 1 μm, the distance T1 between centers of adjacent depressed portions is 3 μm, and the separation distance of the depressed portions is 2 μm.

As described above, etaloning can be suppressed by forming depressed portions, and a back-illuminated solid-state image pickup device with which image degradation due to etaloning is suppressed and image quality can be improved can thereby be provided, The present invention is not limited to the embodiment described above, and for example, a compound semiconductor, such as GaAs, GaN, etc., may be used as the semiconductor material. Also, as the pixels in the photosensitive region, photodiodes of a MOS type image sensor may be employed.

REFERENCE SIGNS LIST

100: back-illuminated solid-state image pickup device, L: incident light, 1: protective film, 2: charge transfer electrode, 3: insulating layer, 4: semiconductor substrate, 5: antireflection film, 4A: N-type semiconductor layer, 4B: isolation region, 4C: P-type semiconductor substrate, 4D: accumulation layer.

The invention claimed is:

1. A back-illuminated solid-state image pickup device comprising:
   a first conductivity type semiconductor substrate having a light incident surface at a back surface side;
   a second conductivity type semiconductor layer provided on an opposite side of the light incident surface of first conductive type semiconductor substrate;
   an insulating layer provided on the second conductive type semiconductor layer, a first interface being formed between the second conductivity type semiconductor layer and the insulating layer and
   a charge transfer electrode disposed on an opposite side of the first interface of the insulating layer, wherein
   the solid-state image pickup device is a charge coupled device,
   the first conductivity type semiconductor substrate and the second conductivity type semiconductor layer are comprised of silicon, and
   the first interface has an uneven surface comprised of a plurality of concaves distributed over the first interface, wherein
   the concaves continue smoothly, and
   the charge transfer electrode covers the plurality of concaves.

2. The back-illuminated solid-state image pickup device according to claim 1,
   wherein
   the light incident surface of the first conductivity type semiconductor substrate is flat, and
   the opposite side of first conductive type semiconductor substrate has an uneven surface.

3. The back-illuminated solid-state image pickup device according to claim 1,
   wherein, within the uneven surface, respective unevenness pattern within respective pixels of the back-illuminated solid-state image pickup device are the same.

4. The back-illuminated solid-state image pickup device according to claim 1,
   wherein a main semiconductor substrate comprises:
      the first conductivity type semiconductor substrate; and
      the second conductivity type semiconductor layer, and
   wherein, when D1 is a distance along a thickness direction of the main semiconductor substrate between a deepest portion of a depressed portion and an apex or top surface of a projected portion of the uneven surface, the distance D1 is 0.06 to 1 μm.

5. The back-illuminated solid-state image pickup device according to claim 1,
   wherein
   a second interface is formed between the insulating layer and the charge transfer electrode, and
   the second interface has an uneven surface.

* * * * *